United States Patent [19]

Maida

[11] 4,310,606
[45] Jan. 12, 1982

[54] BATTERY VOLTAGE CHECKING DEVICE

[75] Inventor: Osamu Maida, Tokyo, Japan

[73] Assignee: Nippon Kogaku K.K., Tokyo, Japan

[21] Appl. No.: 197,619

[22] Filed: Oct. 16, 1980

Related U.S. Application Data

[63] Continuation of Ser. No. 109,279, Jan. 3, 1980, abandoned.

[30] Foreign Application Priority Data

Feb. 1, 1979 [JP] Japan .............................. 54-10749[U]

[51] Int. Cl.³ .......................................... H01M 10/48
[52] U.S. Cl. ....................................... 429/93; 320/48; 324/426
[58] Field of Search ..................................... 429/90–93, 429/61; 320/48; 324/426–428, 433, 434

[56] References Cited

U.S. PATENT DOCUMENTS 3,956,720  5/1976  Vest .................................. 429/93 X
4,020,243  4/1977  Oldford ............................... 429/93

*Primary Examiner*—Charles F. LeFevour
*Attorney, Agent, or Firm*—Fitzpatrick, Cella, Harper & Scinto

[57] ABSTRACT

A device to which a plurality of battery cases having different nominal voltages are selectively mountable and which checks the battery voltage of a mounted case comprises signal apparatus provided on each of the cases and which emits a discrimination signal capable of discriminating which of the cases has been mounted, voltage check apparatus including a plurality of voltage check circuits corresponding to the cases to check each of the output voltages of the batteries contained in the cases, and apparatus operatively associated with the signal apparatus during said mounting for selecting one of the voltage check circuits in accordance with the discrimination signal and applying to the selected voltage check circuit the output voltage of the battery contained in the mounted case as a voltage to be checked.

23 Claims, 7 Drawing Figures

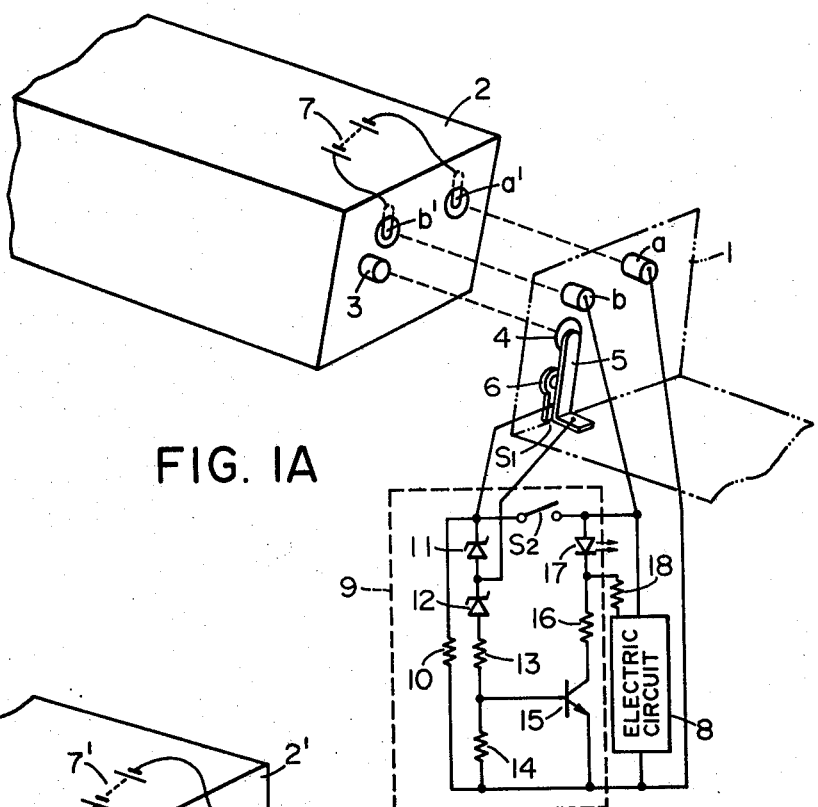
FIG. IA
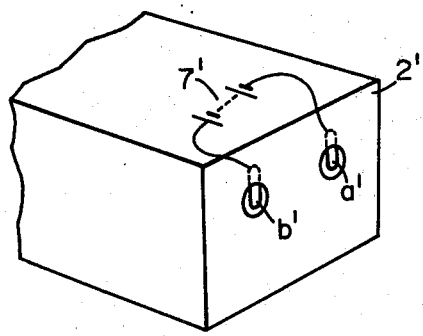
FIG. IB
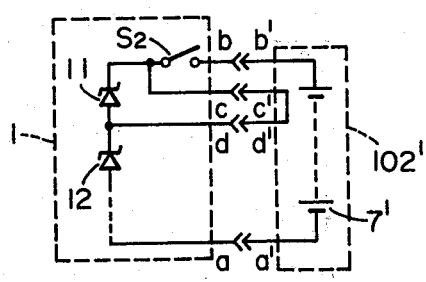
FIG. 2

BATTERY VOLTAGE CHECKING DEVICE

This is a continuation of application Ser. No. 109,279, filed Jan. 3, 1980, now abandoned.

BACKGROUND OF THE INVENTION

1. Field of the Invention

This invention relates to a device for determining whether or not the voltage of a battery used with various instruments, such as photographic cameras, is sufficient for use with the instruments.

2. Description of the Prior Art

When the photographing frame speed is to be increased in the motor drive device of a camera or when slow motion photography is to be effected with a cinecamera, these cameras sometimes require a voltage higher than the commonly used voltage. Usually, such cameras are operated by batteries. It is therefore conceivable to contain two batteries having different nominal voltages in discrete cases and to interchangeably mount each of these cases to an instrument such as a motor drive device or a cinecamera.

Now, in instruments using batteries, it has been a common practice to check to determine whether or not the voltage of the battery is sufficient for the voltage used by the instrument. However, when batteries having different nominal voltages are used by being interchangeably mounted, as described above, the check of battery voltage has heretofore been effected only for one nominal voltage. Therefore, inconveniently, the check could not be effected for the battery of another nominal voltage.

SUMMARY OF THE INVENTION

It is the object of the present invention to provide a battery voltage checking device which enables selected one of a plurality of battery cases having different nominal voltages to be interchangeably mounted to the body of an instrument and which can determine the output voltage of each of the batteries interchangeably mounted.

There has thus been outlined rather broadly the more important features of the invention in order that the detailed description thereof that follows may be better understood and in order that the present contribution to the art may be better appreciated. There are, of course, additional features of the invention that will be described hereinafter and which will form the subject of the claims appended hereto. Those skilled in the art will appreciate that the conception upon which this disclosure is based may readily be utilized as a basis for the designing of other structures for carrying out the several purposes of the invention. It is important, therefore, that the claims be regarded as including such equivalent constructions as do not depart from the spirit and scope of the invention.

BRIEF DESCRIPTION OF THE DRAWINGS

Specific embodiments of the invention have been chosen for purposes of illustration and description, and are shown in the accompanying drawings, forming a part of the specification wherein:

FIGS. 1A and 1B are perspective views of the device according to a first embodiment of the present invention including a circuit connection diagram;

FIG. 2 is a connection diagram of the device according to a second embodiment of the present invention.

DESCRIPTION OF THE PREFERRED EMBODIMENTS

Figure 3:
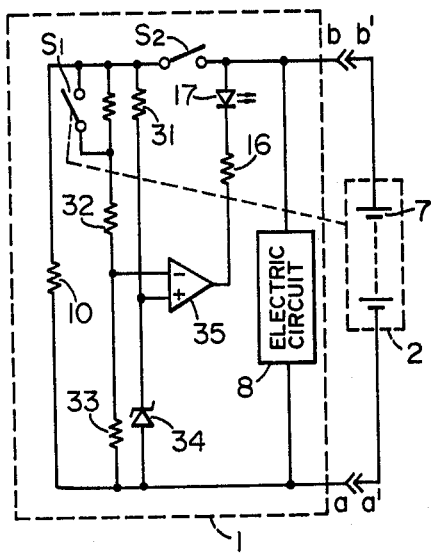
FIGS. 3 to 6 are connection diagrams of the voltage check circuits according to third to sixth embodiments of the present invention.

As an embodiment of the present invention, description will be made of a situation wherein two battery cases respectively containing a battery capable of applying a high voltage and a battery capable of applying a low voltage may be interchangeably mounted to the body of an instrument and used.

In FIG. 1A, the body 1 of the motor drive device or the like of a camera has terminals a and b capable of being supplied with power from outside, and a high voltage battery 7 for supplying power to an electric circuit 8 including a motor, etc. provided in the body 1, is contained in a battery case 2 and, as shown in FIG. 1B, a low voltage battery 7' is contained in a battery case 2'. On the battery case 2, a signal member for identifying a high voltage, namely, a projected pin 3, is provided at a position whereat it is engageable with the body 1. The cases 2 and 2' are respectively provided with output terminals a' and b' which may contact the terminals a and b of the body 1 when these cases are mounted to the body. The body 1 includes a check circuit 9 supplied with power in parallel to the electric circuit 8.

When the case 2 is mounted to the instrument body 1, the projected pin 3 engages the movable contact 5 of a selector switch $S_1$, comprising a fixed contact 6 and the movable contact 5, through an aperture 4, thereby to open the selector switch $S_1$. The projected pin 3 is not provided on the case 2', as seen from FIG. 1B.

On the other hand, the check circuit 9 comprises an LED 17 which, when necessary, may close a check switch $S_2$ and display that the battery voltage is sufficient, Zener diodes 11, 12 for dividing the output voltages of the batteries, resistors 13, 14, and a transistor 15 for detecting and comparing the divided voltages. The LED 17 is driven by the electric circuit 8 through a resistor 18 so that it may display a warning upon termination of film or upon termination of rewind in the motor drive device, for example. A resistor 10 supplied with power from the batteries forms a dummy resistor constructed and arranged so as to flow a current substantially equal to the operating current of the electric circuit 8 during the battery check-up.

If the check switch $S_2$ is closed when the case 2 is mounted, the selector switch $S_1$ is opened as already described, and the Zener diodes 11 and 12 become series-connected, so that a voltage resulting from subtracting the sum of two Zener voltages from the voltage of the battery 7 is divided by resistors 13 and 14 and the divided voltage is applied to the base of a transistor 15.

When this divided voltage is greater than the base-emitter threshold voltage $V_{BE}$, the transistor 15 conducts and the LED 17, supplied with power through a resistor 16, emits light to indicate that the source voltage is sufficient.

When the battery case 2', which applies a low voltage is mounted, the selector switch $S_1$ remains closed and the Zener diode 11 is short-circuited, because this case 2' does not have the projected pin 3, as already described. In this case, the voltage at the checkpoint is decreased by an amount corresponding to the Zener voltage by the Zener diode 11. That is, the Zener diode 11 may be constructed and arranged so that it has, as the Zener voltage, a voltage corresponding to the difference between the nominal voltage of the mounted high voltage battery 7 and the nominal voltage of the low voltage battery 7'.

When the Zener diode 11 is so arranged, even if the high voltage battery 7 or the low voltage battery 7' is mounted, only the difference between the nominal output voltages of these batteries is shifted, as already described, and therefore, the voltage divided by the resistors 13 and 14 and applied to the base of the transistor 15 can be made to exceed the threshold voltage $V_{BE}$ of the transistor when each of the output voltages of the two batteries is sufficient.

FIG. 2 shows a second embodiment in the form of a circuit diagram. In this case, however, terminals c,c' and d,d' instead of the projected pin 3 and the selector switch $S_1$ are provided on the instrument body 1 side and the case 102' side in opposed relationship to each other. The case 102' applying a low voltage is always short-circuited between the terminals c' and d', as shown, and a case (not shown) applying a high voltage is always opened between the terminals c' and d'. Accordingly, by using these terminals instead of the selector switch $S_1$ of the first embodiment, the check of the battery voltages is made possible, as in the first embodiment.

Other circuits in which a preset voltage is changed over in accordance with the output voltages of the batteries mounted as described above would occur to mind. Embodiments of such circuits will hereinafter be described.

In FIG. 3, when the check switch $S_2$ is closed, a reference voltage $V_r$ is produced by a Zener diode 34. Resistors 31, 32 and 33 change over the voltage division ratio of a voltage dividing circuit constructed so as to divide the output voltages of the batteries by opening-closing of the selector switch $S_1$ as shown in the first embodiment, and the reference voltage and the divided voltage are compared by a comparator circuit 35 to control the turn-on of LED 31. That is, when the high voltage battery 7 is mounted, the selector switch $S_1$ is opened by the projected pin 3, as previously described, and the resistors 31 and 32 become series-connected, and when the low voltage battery 7' is mounted, the selector switch $S_1$ remains closed and so, the resistor 31 is short-circuited. Accordingly, the values of the resistors 31, 32 and 33 may be determined so that, when each of the output voltages of the batteries 7 and 7' is sufficient, the present divided voltage is higher than the reference voltage $V_r$.

Figure 4:
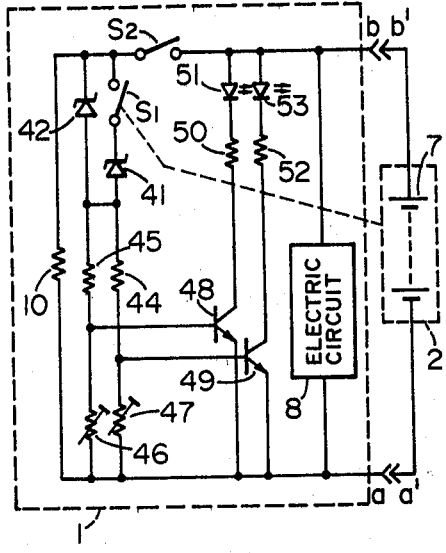

A fourth embodiment shown in FIG. 4 is a circuit which not only indicates whether or not the voltage of the mounted battery is sufficient, but also detects and displays the substantially mean voltage thereof. That is, this is a circuit in which two light-emitting diodes are provided so that when the voltage of the battery is sufficiently high, both LED 51 and LED 53 are turned on, that when the voltage of the battery is a little lower, one of the light-emitting diodes is turned on, and that when the voltage of the battery is still lower, neither of the two light-emitting diodes are turned on.

When the case 2 having the high voltage battery 7 is mounted, the selector switch $S_1$ is opened. When the check switch $S_2$ is closed, the voltage level-shifted by a Zener diode 42 is applied to a first voltage dividing circuit (resistors 45, 46) and a second voltage dividing circuit (resistors 44, 47). These voltage dividing circuits differ in voltage division ratio and when the voltage of the battery 7 is sufficiently high, the two divided voltages both exceed the $V_{BE}$ of the transistor. Consequently, transistors 48 and 49 conduct to permit a current to flow to LED 51 and LED 53 through resistors 50 and 52, thus turning on two light-emitting diodes. When the voltage of the battery drops below the aforementioned voltage and for example, the divided voltage of the first voltage dividing circuit becomes lower than $V_{BE}$ and the divided voltage of the second voltage dividing circuit becomes higher than $V_{BE}$, only LED 53 is turned on. When the voltage of the battery 7 further drops, the two divided voltages of the first and second voltage dividing circuits both become lower than $V_{BE}$, so that neither LED 51 nor LED 53 are turned on.

Next, when the case 2' having the low voltage battery 7' is mounted, the selector switch $S_1$ is closed and Zener diodes 42 and 41 become parallel-connected. Since the Zener voltage of the Zener diode 41 is of a value lower than the Zener voltage of the Zener diode 42, little or no current flows to the Zener diode 42 and the voltage level-shifted by the Zener diode 41 is applied to the first and second voltage dividing circuits. Therefore, the difference between the Zener voltages of the Zener diodes 41 and 42 may be made equal to the difference between the nominal voltages of the batteries 7 and 7'. Turn-on and turn-off of LED 51 and LED 53 take place in the described manner.

Figure 5:
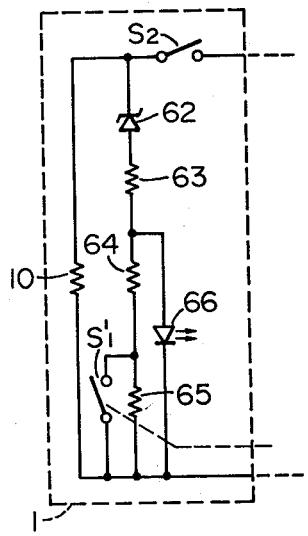

In a fifth embodiment shown in FIG. 5, conversely to the embodiments hitherto described, the projected pin 3 is provided on the battery case 2' having the low voltage battery 7'. This is an example of the circuit in which, conversely to the aforementioned embodiments, the selector switch $S_1$ is opened when the battery case 2' is mounted. This embodiment positively utilizes the threshold voltage $V_f$ (forward voltage drop) of a display LED 66. That is, when the battery case 2' is mounted, the selector switch $S_1$ is opened and resistors 64 and 65 become series-connected and, when the battery case 2 is mounted, the selector switch $S_1$ is closed and the resistor 65 is bypassed. Accordingly, in the case of the low voltage, the voltage division ratio is selected to a small value by the use of resistors 63, 64, 65 and in the case of the high voltage, the voltage division ratio is selected to a great value by the use of resistors 63, 64, whereby even if either of the high voltage battery or the low voltage battery is mounted, when the output voltage of the mounted battery is sufficient, this divided voltage may always be higher than the $V_f$ of LED 66. Consequently, if the divided voltage is higher than $V_f$, LED 66 is turned on. Zener diode 62 has a Zener voltage lower than the source voltage of the battery minus $V_f$ of LED 66.

Figure 6:
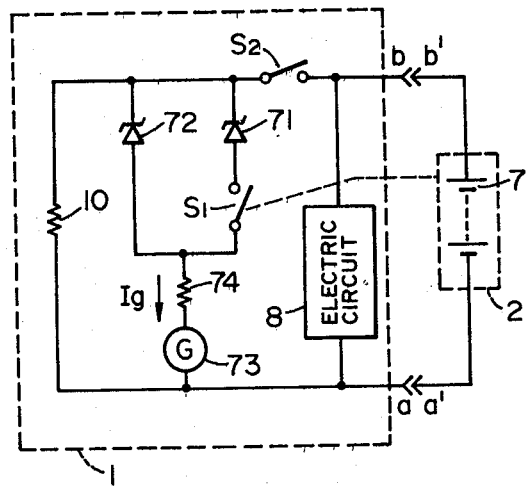

FIG. 6 shows a circuit connection wherein a meter is used as the display means. The value of the Zener voltage of Zener diode 71 is lower than that of Zener diode 72 and the difference between the two Zener voltages equal to the difference between the nominal output voltages of the high voltage battery 7 and the low voltage battery 7'. Accordingly, when the high voltage battery 7 is mounted, the selector switch $S_1$ is opened, as described previously, and a series circuit of Zener diode 72, meter 73 and resistor 74 is formed and a current Ig flows. Next, when the low voltage battery 7' is mounted, the selector switch $S_1$ is closed, and the Zener diode 72 and the Zener diode 71 become parallel-connected. Accordingly, even if the voltage of the mounted battery differs, when the voltage of that battery is sufficient, the current Ig greater than a certain value can be supplied. By suitably setting the value of this current Ig, the meter 73 measures the battery voltage. In this circuit connection, the set voltage is applied to resistor 74 and meter 73.

Although not shown in the above-described embodiments, a plurality of Zener diodes or the like may be series-connected to the base or emitter of the transistor and a discrimination switch $S_1$ may be provided so that these diodes are selectively short-circuited.

Also, in these embodiments, the discrimination switch $S_1$ is provided so as to vary the set voltage, i.e. the shift voltage of the shift circuit or the voltage division ratio of the voltage dividing circuit in response to the mounting of the battery case. However, a construction may also be adopted in which the reference voltage is varied such that it becomes high when the high voltage battery is mounted and becomes low when the low voltage battery is mounted.

I believe that the construction and operation of my novel battery voltage checking device will now be understood and that the several advantages thereof will be fully appreciated by those persons skilled in the art.

I claim:

1. A device to which a plurality of cases containing therein batteries capable of applying different nominal voltages are selectively mountable and which checks the battery voltage of a mounted case, comprising:
   signal means provided on at least one of said plurality of cases and emitting a discrimination signal to indicate which of said cases has been mounted;
   voltage check means including a plurality of voltage check circuits corresponding to said cases to check each of the output voltages of the batteries contained in said plurality of cases; and
   selector means operativey associated with said signal means during said mounting to select one of said plurality of voltage check circuits in accordance with said discrimination signal and apply to said selected voltage check circuit the output voltage of the battery contained in said mounted case as a voltage to be checked.

2. The device according to claim 1, wherein said voltage check means has a voltage dividing circuit with a voltage division ratio that is variable in response to said selector means and is supplied with power by the battery voltage of said mounted case, and includes set voltage generating means capable of applying the divided voltage of said voltage dividing circuit as a set voltage in a preset range notwithstanding the difference between said nominal voltages.

3. The device according to claim 1, wherein said voltage check means has a semiconductor element and includes reference voltage generating means capable of applying the threshold voltage of said element as a reference voltage.

4. The device according to claim 3, wherein said voltage check means has a voltage dividing circuit with a voltage division ratio that is variable and is supplied with power by the battery voltage of said mounted case, and includes set voltage generating means capable of applying the divided voltage of said voltage dividing circuit as a set voltage in a preset range.

5. The device according to claim 4, wherein said set voltage generating means and said reference voltage generating means can change one of the voltage division ratio of said voltage dividing circuit and said reference voltage in association with said selector means so that when the battery voltage of said mounted case is sufficient, said set voltage becomes higher than said reference voltage notwithstanding the difference between said nominal voltages.

6. The device according to claim 5, wherein said voltage check means includes display means and comparator means for comparing said set voltage with said reference voltage and driving said display means when said set voltage is higher than said reference voltage, to display the fact that said battery voltage is sufficient.

7. The device according to either of claims 2 or 6, wherein said selector means includes a selector switch provided in that portion of said device which engages said case and is operable upon reception of said discrimination signal.

8. The device according to claim 7, wherein said signal means has a projected pin as said discrimination signal and said switch has a contact engageable with said projected pin during the mounting of said case and is displaceable thereby.

9. The device according to claim 8, wherein said set voltage generating means includes a plurality of Zener diodes for shifting a voltage corresponding to the difference between the nominal voltages of said plurality of batteries upon operation of said switch during the mounting of said case.

10. In a load device to which a plurality of battery cases having different rated voltages from each other are selectively mountable and which is operable by the output voltage of the mounted battery case, a device for checking the output voltage of the mounted case, comprising:
   (a) a pair of output terminals provided on each battery case;
   (b) a pair of input terminals provided on said load device to be connected to said pair of output terminals of the mounted battery case;
   (c) voltage check means having a plurality of voltage check levels corresponding to said rated voltages to check the voltage applied to said input terminals; and
   (d) means for selecting the check level corresponding to the said rated voltage out of the plurality of the check levels.

11. A voltage check device according to claim 10, wherein said battery cases include a case for receiving a battery having higher rated voltage and a case for receiving a battery having lower rated voltage.

12. A voltage check device according to claim 11, wherein one of the said higher and lower voltage battery cases has a pin projected on a portion to be mounted on said load device; and said selecting means has a switch provided on a portion of the load device to mount the case, the switch being actuated by said pin.

13. A voltage check device according to claim 11, wherein one of said higher and lower voltage battery cases is provided with a conductive member at a portion to be mounted on said load device; and said selecting means has a pair of terminals to be connected through said conductive member.

14. A voltage check device according to claim 12 or 13, wherein said voltage check means includes a voltage dividing means for dividing the voltage applied to the input terminals to have a predetermined ratio in accordance with said rated voltage, in association with the actuation of said switch or the connection of said terminals of the selecting means.

15. A voltage check device according to claim 14, wherein said voltage check means includes a semiconductor element whose threshold voltage serves as a predetermined reference voltage, a detecting circuit for comparing said divided voltage with said reference voltage and generating a detecting signal when the divided voltage is higher than said reference voltage, and a display element which is energized in accordance with the detecting signal.

16. A voltage check device according to claim 14, wherein said voltage check means includes a light emitting diode which is energized when said divided voltage is higher than the threshold voltage of said diode.

17. A voltage check device according to claim 14, wherein said voltage check means further includes a meter for measuring the divided voltage.

18. A voltage check device according to claim 12 or 13, wherein said voltage check means includes a circuit for shifting the voltage applied to said input terminals to a predetermined voltage in accordance with said rated voltage.

19. A voltage check device according to claim 18, wherein said voltage check means includes a semiconductor element whose threshold voltage serves as a predetermined reference voltage, a detecting circuit for comparing said shifted voltage with said reference voltage and generating a detecting signal when the shifted voltage is higher than said reference voltage, and a display element which is energized in accordance with the detecting signal.

20. A voltage check device according to claim 18, wherein said voltage check means includes a light emitting diode which is energized when said shifted voltage is higher than the threshold voltage of said diode.

21. A voltage check device according to claim 14, wherein said voltage check means further includes a meter for measuring the shifted voltage.

22. A voltage check device according to claim 14, wherein said voltage check means includes two transistors, two light-emitting diodes respectively connected to said collectors of said transistors and energized in response to the conductance of said transistors, and two sets of series-connected-resistor-circuits to which are applied said shifted voltage to produce two divided voltages of different division ratios, said two divided voltages being determined to be higher than the threshold voltages between the bases and emittors of said two transistors when the output voltage of the battery case mounted is sufficient.

23. In a load device to which a plurality of battery cases having different rated voltages from each other are selectively mountable and which is operable by the output voltage of the mounted battery case, a device for checking the output voltage of the mounted case, comprising:
a pair of input terminals provided on said load device to be connected to a pair of output terminals of the mounted battery case;
voltage check means having a plurality of voltage check levels corresponding to said rated voltages to check the voltage applied to said input terminals; and
means for selecting the check level corresponding to the said rated voltage out of the plurality of said check levels.

* * * * *